United States Patent [19]

Matzen

[11] 4,218,650

[45] Aug. 19, 1980

[54] APPARATUS FOR MEASURING SEMICONDUCTOR DEVICE RESISTANCE

[76] Inventor: Robert A. Frosch, Administrator of the National Aeronautics and Space Administration, with respect to an invention of Walter J. Matzen, Richardson, Tex.

[21] Appl. No.: 918,534

[22] Filed: Jun. 23, 1978

[51] Int. Cl.² .................. G01R 27/02; G01R 27/14
[52] U.S. Cl. ........................................ 324/62; 324/64
[58] Field of Search ............ 324/62, 64, 65 P, 65 R

[56] References Cited

U.S. PATENT DOCUMENTS

| | | | |
|---|---|---|---|
| 2,437,697 | 3/1948 | Kalom | 324/65 R X |
| 3,115,602 | 12/1963 | Sutton et al. | 324/64 X |
| 3,229,200 | 1/1966 | Rayburn | 324/65 P |
| 3,754,186 | 8/1973 | Sambhu | 324/65 R |
| 3,988,669 | 10/1976 | Fasching | 324/64 X |

OTHER PUBLICATIONS

Dahmen, Measuring the Contact Resistance of Metallization on Silicon, IBM Technical Disclosure Bulletin, Aug. 1971, p. 969.
Moffitt, A Versatile & Economical Impedance Plethysmograph, Instrumentation Symposium, May 1972, pp. 15–20.

*Primary Examiner*—Ernest F. Karlsen
*Attorney, Agent, or Firm*—Monte F. Mott; John R. Manning; Paul F. McCaul

[57] ABSTRACT

A test structure for enabling the accurate measurement of the resistance characteristics of a semiconductor material, of the type which includes one or more pairs of electrical terminals disposed on the surface of the material to enable measurements of the resistance encountered by currents passed between the terminals. A pair of terminals includes a first terminal extending in a closed path, such as a circle, around a second terminal, so that all currents flowing between the terminals flows along a region of known width and length. Two or more pairs of concentric terminals can be utilized, wherein the ratio of radii of each pair of terminals is the same as the ratio for all other pairs of terminals, to facilitate the calculation of the contact resistance between each terminal and the semiconductor surface, as well as the calculation of the resistance of the semiconductor material apart from the effect of the terminal-to-semiconductor contact resistances.

2 Claims, 8 Drawing Figures

FIG. 1 PRIOR ART
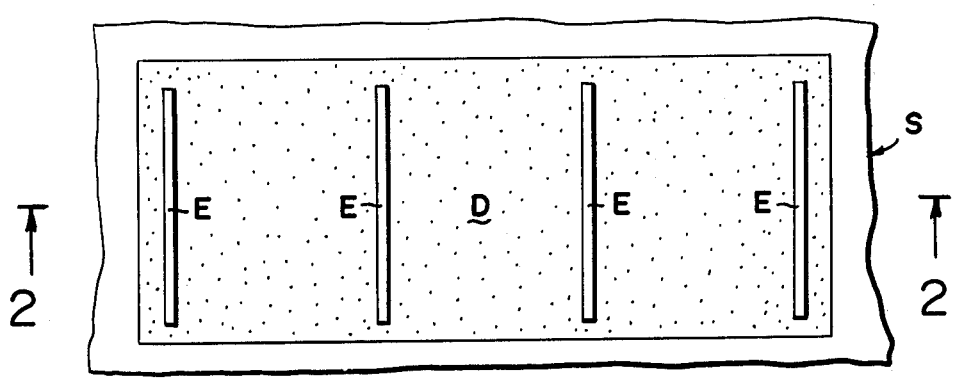
FIG. 2 PRIOR ART
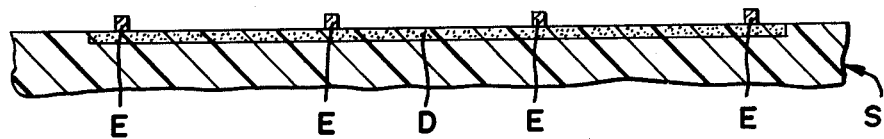
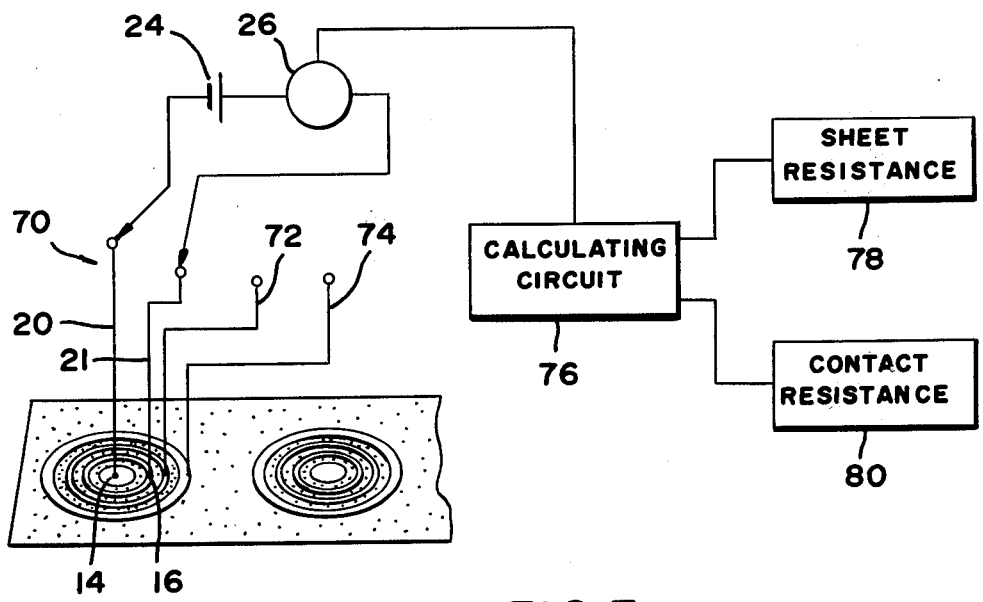
FIG. 3

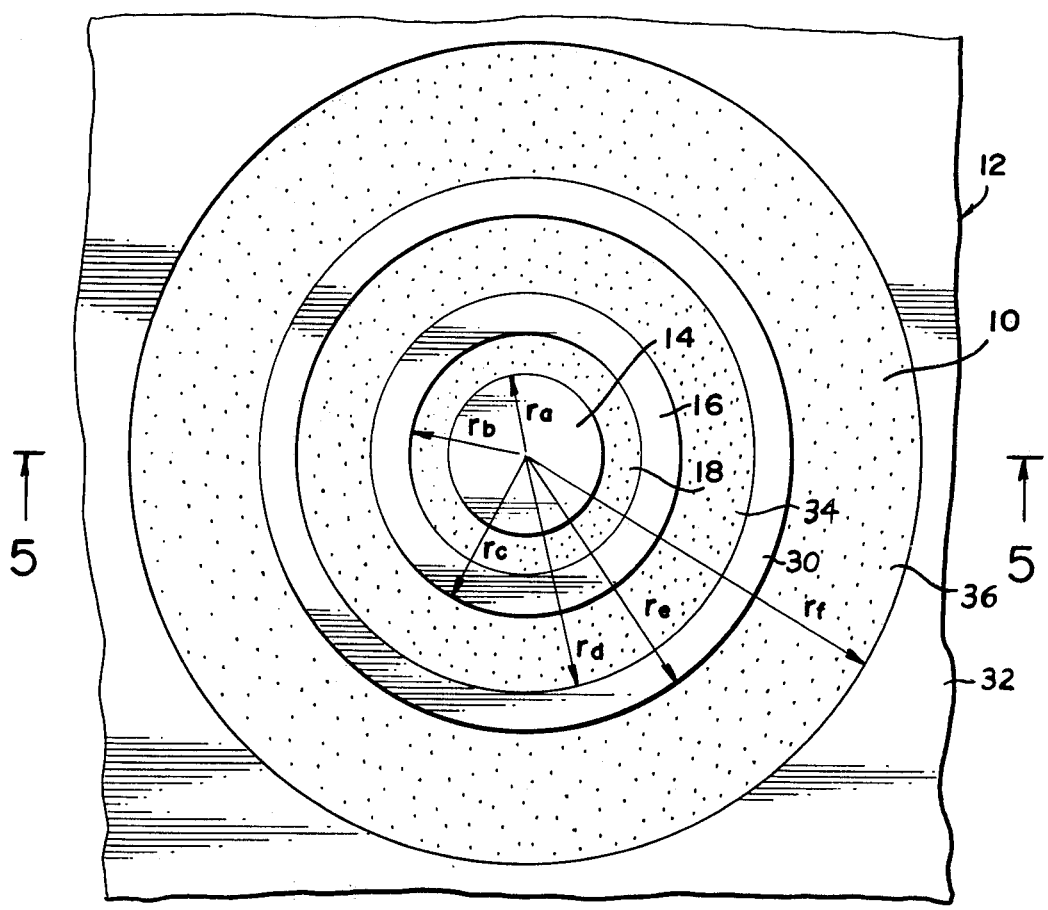
FIG. 4
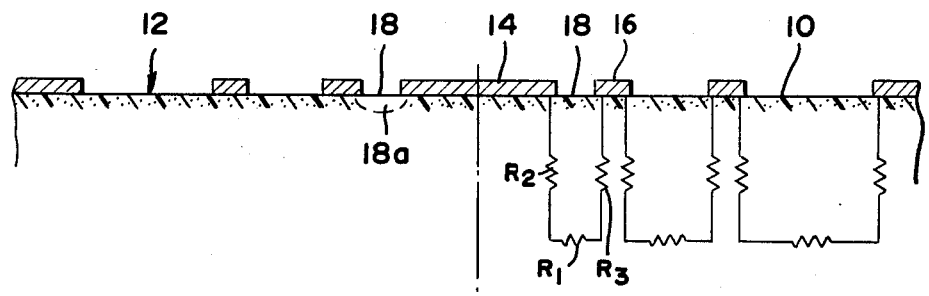
FIG. 5
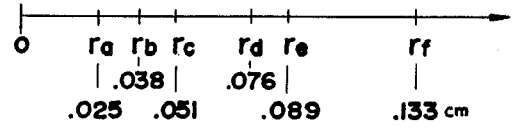

APPARATUS FOR MEASURING SEMICONDUCTOR DEVICE RESISTANCE

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

BACKGROUND OF THE INVENTION

Test structures are commonly used on silicon slices to enable the continuous monitoring of the slices as they are processed. The diffusion of impurities into a silicon slice may change its conductivity from N-type to P-type or vice versa and decrease its resistivity, and a measurement of resistivity can indicate the level of impurity diffusion. For example, in a typical solar cell process a region of N-type impurity having a sheet resistance of 60 ohms per square is diffused into a P-type silicon slice to a depth of 0.01 mil (thousandth of an inch). The resistance of the diffused region provides an indication of the density of impurity diffusion. The bulk resistivity of the undiffused silicon is typically one to 10 ohm-cm and typically has a resistivity several orders of magnitude greater than the diffused region. A typical test structure includes a series of metal terminals or contacts deposited at spaced locations along the slices. The resistance measured between a pair of adjacent contacts, enables the monitoring of the sheet resistance of the silicon, and therefore the processing step. Such test structures are useful on a variety of semiconductor devices, for example in the manufacture of solar cell material.

One type of test pattern of deposited contacts includes a series of parallel metal strips, each contacting a diffused region of a silicon slice which is defined in the surface of the slice by oxide masking. The metal contacts are not allowed to extend to the edge of the diffused region, so that the resistance measured between a pair of contacts is affected by the indefinite region beyond the ends of the bars along which currents may move in passing between the contacts. Also the surface of the P-region surrounding the N+ region can invert, so as to give erroneous readings of resistance in the N+ diffused region. A simple test pattern which enabled the measurement of the resistance of a semiconductor material for currents passing through a known limited area, would enable such measurements to be more accurately made in a wider variety of situations.

SUMMARY OF THE INVENTION

In accordance with one embodiment of the present invention, a test structure is provided for application to a semiconductor material, which enables the more accurate measurement of the resistance of the material. The test structure includes at least one pair of electrical terminals contacting the surface of the material, with one of the terminals extending in a closed path and the other terminal lying within the closed path of the first terminal. This can be accomplished by forming one terminal area as a ring and another terminal area as a ring or circle concentric with the first terminal. The resistance between the terminals can be measured, to thereby provide an indication of the resistance of the semiconductor material in the region thereof which lies between the terminals.

The resistance of the semiconductor material, apart from the contact resistance between the metal terminals and the surface of the semiconductor material, can be determined by the use of at least two pairs of terminals. The calculation of the material resistance and the contact resistance can be facilitated by utilizing pairs of terminals having a predetermined spacing relationship. That is, the ratio between the adjacent radiuses of a first pair of contacts, is equal to the ratio of radiuses of a second pair of contacts.

The novel features of the invention are set forth with particularity in the appended claims. The invention will be best understood from the following description when read in conjunction with the accompanying drawings.

BRIEF DESCRIPTION OF THE DRAWINGS

FIG. 1 is a partial plan view of a prior art test pattern, shown emplaced on the diffused region of a sheet of semiconductor material.

FIG. 2 is a view taken on the line 2—2 of FIG. 1.

FIG. 3 is a partially perspective and block diagram view of a test structure constructed in accordance with the present invention.

FIG. 4 is a partial plan view of the test structure of FIG. 3.

FIG. 5 is a view taken on the line 5—5 of FIG. 4, and also showing a representation of the resistances encountered in the device of FIG. 4.

DESCRIPTION OF THE PREFERRED EMBODIMENTS

Figure 6:
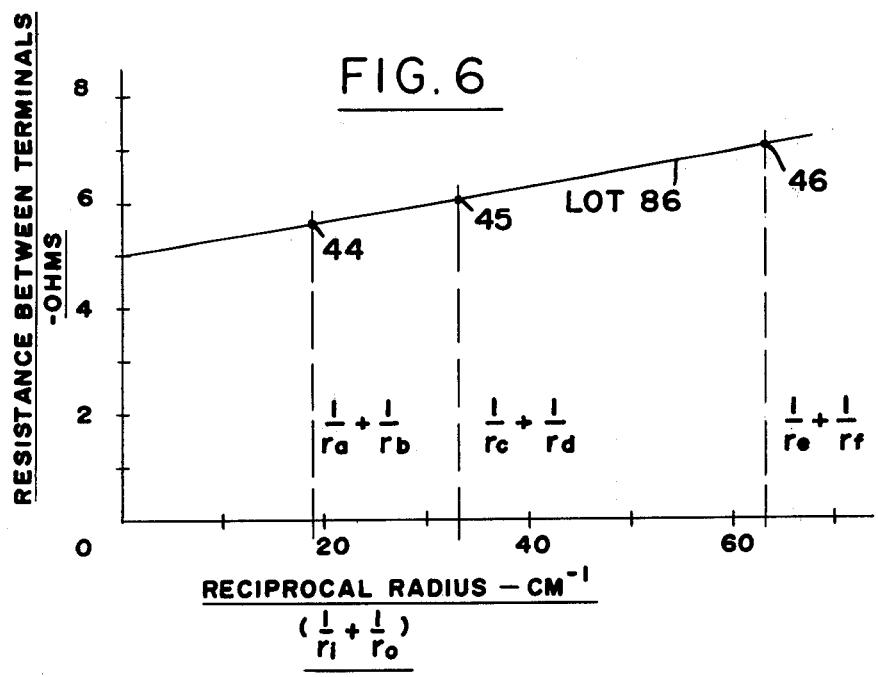
FIG. 6 is a graph showing how the sheet resistance of a material can be calculated.

FIGS. 1 and 2 illustrate a prior art technique which has been utilized to measure the sheet resistance of a diffused region D of a sheet S of silicon semiconductor material. The technique involves the defining of the diffused region D in the sheet of silicon and the depositing of strip shaped contacts, or terminals E, on the surface of the diffused region. A terminal can be defined as an equi-potential metallic contact. The resistance between a pair of adjacent terminals E is measured. For well defined and controlled processing procedures, most of the resistance between the terminals is due to the resistance of the diffused region D of the semiconductor material. By noting the spacing between a pair of terminals E and the resistance measured between them, a calculation can be made as to the resistivity of the diffused region D of semiconductor material.

The technique indicated in FIGS. 1 and 2 does not provide a reliably precise indication of the sheet resistance of a material. In the case of an N-type diffusion into a P-type slice, the surface of the P-type region may invert, becoming N-type and providing a shunt path around the edges of the metal strip. Another problem is that some of the current flowing between the pair of terminals E flows in the region beyond the ends of the terminals, and it is difficult to precisely calculate the effect of this current flow in the resistance measurement. Another problem is that there is some contact resistance between each terminal E and the surface S of the diffused region of the semiconductor, which results in a somewhat higher measured resistance than that due solely to the sheet resistance of the semiconductor material.

FIG. 4 illustrates a test pattern of the present invention, which can be applied to the surface 10 of a body 12 of the resistance characteristics of the material. The test pattern includes several contacts, or terminals, including a circular terminal 14 and a ring-shaped terminal 16 concentric with the circular terminal. Since the ring terminal 16 extends in a closed path completely around the circular terminal 14, a current flowing between the two terminals 14, 16 flows almost completely through only the limited region 18 of semiconductor material which lies between the terminals, that is, the volume of the semiconductor material which lies at and below the surface at 18 as shown in a plan view. The region 18a in FIG. 5 is an indication of the effective current path in the semiconductor. It may be noted that a diffused region has a small depth such as one-hundreth of a mil (thousandth of an inch) for a solar cell, and that essentially all of the current is confined to that diffused region because of the formation of a junction between the diffused region and the underlying silicon of opposite type. Largely the same effect occurs where the underlying region is of the same conductivity type, but has a much higher resistivity.

An actual measurement of surface resistance can be made by the equipment shown in FIG. 3, which includes a pair of probes 20, 21 connected to the terminals 14, 16, and a resistance measuring device which includes a voltage cell 24 which applies a predetermined voltage between the probes 20, 22 and a current measuring instrument 26. It may be noted that the voltage-measuring probes 20, 21 are very thin, and that the effects of any resistance between the probes and terminals is normaly avoided by the use of a kelvin probe apparatus. In such an apparatus, a separate pair of probes (not shown) is utilized to measure the voltage between the pair of terminals, and the voltage measured by such additional probes and the current flow measured by means of probes 20, 21 is utilized to calculate resistance. Where there is negligible terminal-to-semiconductor contact resistance, the lateral resistance which will be measured between a pair of contacts 14, 16 is given by $$R_o = \frac{p_s}{2\pi} \ln \frac{r_a}{r_b} \qquad \text{Eq. 1}$$

where $R_o$ is the resistance due to the semiconductor material, $p_s$ is the sheet resistance or resistivity of the diffused region 18 being measured, $r_a$ is the outside radius of the semiconductor section 18, and $r_b$ is the inside radius of the semiconductor section 18. In the structure of FIG. 4, the ratio $r_a$ to $r_b$ is 1.5. If contact resistance were negligible, the resistance measured between the pair of contacts 14, 16 would be $$R_o = 0.06452 p_s$$

or in other words the sheet resistance would be 15.5 $R_o$.

Thus, the resistance of a body of semiconductor material, such as the sheet resistance of a slice of such material, can be more accurately determined by the use of a pair of terminals on the surface of the semiconductor material, wherein one terminal extends in a closed path and the other terminal lies within that closed path, so that all the current which flows through the semiconductor material during a resistance measurement is confined more closely to a predetermined region of semiconductor material. The calculation of resistance can be more easily made by utilizing a pair of terminals wherein the outer terminal 16 has a circular inner edge and the inner terminal 14 has a circular outer edge concentric with the inner edge of the terminal 16.

The contact resistance between terminals such as 16 and the surface 10 of a semiconductor material, can have an effect upon the measured resistance. When the contact resistance is high, the resistance $R_o$ measured between a pair of terminals 14, 16, which should not depend upon the radiuses of the pair of terminals so long as they are in the same ration such as 1.5, will vary with the radiuses of the terminals. The resistance between the pair of terminals such as 14, 16 decreases as the terminals' radii $r_a$ and $r_b$ increases. FIG. 5 shows the equivalent resistance measured between the pair of terminals 14, 16 which is the sum of the resistance $R_1$ representing the resistance of the semiconductor region 18 lying between the terminals, the resistance $R_2$ representing the contact resistance between the terminal 14 and the surface 10 of the semiconductor material, and the resistance $R_3$ representing the contact resistance between the terminal 16 and the surface 10. If the rediuses $r_a$ and $r_b$ increase, then the resistance R, should remain the same, since the semiconductor region 18 will be longer (the distance $r_a - r_b$ will be longer) but will also be wider (the circumference measurement of $2\pi r$, where r is the average of $r_a$ and $r_b$ will be wider). However, the contact resistance $R_2$ should decrease since the length of the contact area ($2\pi r_b$) will be longer, and the contact resistance $R_3$ should be similarly smaller. The fact that the proportion of total resistance due to the contact resistances varies, can be utilized to determine whether contact resistance is significant, and the value of semiconductor sheet resistance. When contact resistance is significant, the value of specific contact resistance can be calculated, and the value of the semiconductor sheet resistance after discounting the contact resistances can be calculated.

A determination of the sheet resistance apart from the contact resistances, can be made by utilizing the structure shown in FIG. 4, wherein additional terminals 30, 32 are established on the surface 10 of the semiconductor. The terminal 30 is formed so that its inner radius $r_d$ is 1.5 times the outer radius $r_c$ of the contact 16. The terminal 32 is formed so that its inner radius $r_f$ is 1.5 times the outer radius $r_e$ of the contact 30. Thus, measurements of the resistance of two additional different regions 34 and 36 of the semiconductor material can be made, wherein the ratios of inner and outer diameters of each of the regions 18, 34, and 36 are all the same, the ratio of 1.5 being chosen here. As mentioned above, the total resistance $R_t$ measured between a pair of terminals, equals the resistance of the semiconductor region indicated at $R_1$ in FIG. 5, plus the contact resistances $R_2$ and $R_3$. Each contact resistances such as $R_2$ is inversely proportional to the contact length (such as $2\pi r_b$ for the outer edge of contact 14). Thus, the measured resistance of the semiconductor ring 18 is of the form $$R_t = R_o + A(1/r_i + 1/r_o) \qquad \text{Eq. 2}$$

where $R_t$ equals the total measured resistance, $R_o$ equals the resistance through the semiconductor material, A is a constant proportional to the contact resistance, $r_i$ is the inner radius of the semiconductor ring whose resistance is being measured (such as radius $r_a$ for semiconductor area 18), and $r_o$ is the outer radius of the semiconductor ring. The values of $R_o$ and A may be determined from a plot of $R_t$ versus $(1/r_i+1/r_o)$ for each set of adjacent contacts or terminals. That is, $R_o$ is the y-axis intercept and A is the slope of the line graph defined by equation 2. Sheet resistance $p_s$ is determined from $R_o$ using equation 1.

It may be noted that the slope A in equation 2 increases with the specific contact resistance $p_c$. Depending upon the expected range of sheet resistance and specific contact resistance, the magnitudes of the radii can be chosen for ease in interpreting the measured values of $R_o$ and A.

FIG. 6 shows a plot of the resistance in ohms which might be measured between each of three pairs of terminals, having the spacings designated in FIG. 5. The three points 44, 45 and 46 show an intercept at a resistance value of 5.0 ohms, this being the resistance attributable to the semiconductor material in the absence of contact resistance between the terminals and the silicon surface. The following table shows the various parameters which can be derived from the plot of FIG. 6

TABLE I

| | |
|---|---|
| $R_o$ Ohms | 5.0 |
| A Ohm cm | .032 |
| $p_s$ Ohms Per Square | 77.5 |
| $p_c$ Ohm cm$^2$ | $5.2 \times 10^{-4}$ | where $R_o$ is the resistance of the semiconductor area between the two terminals, A is a constant defining the slope of the curves, $p_s$ is the calculated values of sheet resistance which can be calculated in accordance with equation 2, and $p_c$ is the contact resistance per unit area calculated on the assumption that current flows from each metal terminal to the semiconductor along a narrow band at the periphery of the terminal, and that the contact resistance approximates the characteristic impedance of a transmission line, and that as in the case here the resistance of the semiconductor material is much higher than the contact resistance. The characteristic impedance of a transmission line can be given by $$R_c = 1/W \sqrt{p_s p_c} \qquad \text{Eq. 3}$$

where W equals $2\pi r$ and is the width of the line and r is the radius at the periphery of the terminal. The slope A in equation 2 is given by $$A = 1/2\pi \sqrt{p_s p_c} \qquad \text{Eq. 4}$$

For typical values of $p_s$ and $p_c$, equation 3 is a good approximation. Of course, the total contact resistance (as opposed to the contact resistance per unit area of the effective contact area) merely equals measured resistance minus $R_o$.

For mass production applications, the test set up of FIG. 3 can be utilized, where a double contact switch 70 can be utilized to pass current between any pair of the probes 20, 21, 72, 74 to measure the resistance. A calculating circuit 76 connected to the meter 26 (and to a voltmeter that utilizes separate pairs of probes to measure voltages between terminals) can calculate the Y-intersection of a graph of the type shown in FIG. 6, to energize a display 78 indicating the sheet resistance of the material. Where desired, the calculating circuit can also calculate and indicate the contact resistance or contact resistance per unit area on a display 80.

Figure 7:
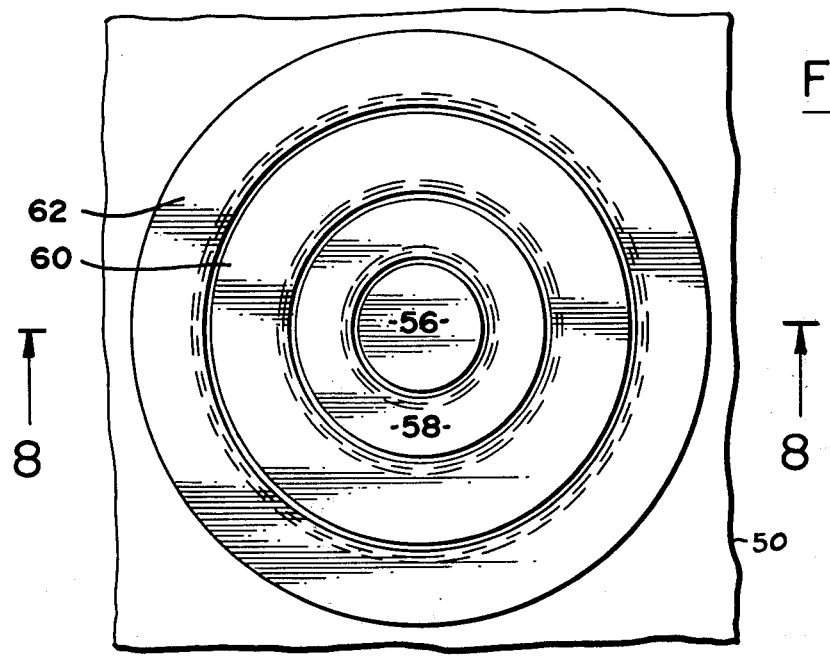
FIG. 7 is a partial plan view of a semiconductor device constructed in accordance with another embodiment of the invention.
Figure 8:
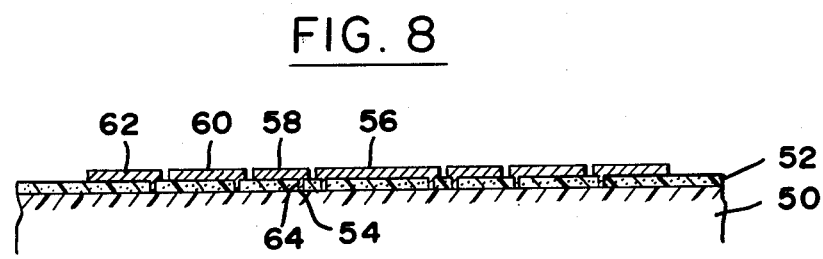
FIG. 8 is a view taken on the line 8—8 of FIG. 7.

In some applications, the test pattern must cover a very small area of a semiconductor sheet, which is so small that it is difficult to make contact between probes and the small terminals to be deposited on the surface of the material. FIGS. 7 and 8 show an arrangement wherein a close test pattern can be established while providing large contact areas for touching by resistance-measuring probes. The semiconductor material 50 is covered with a thin insulative layer 52 such as silicon oxide. Then, narrow ring-shaped areas such as 54 are etched out of the oxide. Finally, terminals such as 56 are deposited on the surface of the oxide and into the grooves 54. This leaves terminals such as 56, 58, 60, and 62 of considerable width, but which contact the semiconductor material 50 along very narrow ring-shaped areas. The narrow bands such as 64 which lie in the grooves 54 to contact the silicon material 50, can be spaced very closely so that an entire test pattern covers only a small area of the device, and yet large terminal areas are provided for contact by resistance-measuring probes.

It may be noted that after a test pattern is established on the surface of a solar cell, a bus bar in the form of a metal strip may be applied over the test pattern to connect several solar cells together, as by soldering the metal strip in place, so that the test pattern does not affect the final performance of the device.

Thus, the invention provides a test pattern for utilization on semiconductor material, which enables the more accurate determination of the resistivity of the material. This can be accomplished by the utilization of at least one pair of contacts, or terminals, wherein one of the terminals extends in a closed path on the surface of the material, and the other terminal of the pair lies within the closed path. The adjacent edges of the pair of terminals are preferably circular and concentric to facilitate the calculation of the resistivity of the material from the resistance measurement. A determination of the influence of the contact resistance between the terminals and the surface of the material, can be obtained by utilizing a plurality of sets of terminals, of different sizes. This can be most easily accomplished by utilizing pairs of terminals whose adjacent edges are all of the same ratio of outer terminal radius to inner terminal radius.

Although particular embodiments of the invention have been described and illustrated herein, it is recognized that modifications and variations may readily occur to those skilled in the art, and consequently, it is intended that the claims be interpreted to cover such modifications and equivalents.

The embodiments of the invention in which an exclusive property or privilege is claimed are defined as follows:

1. In combination with a body of material whose resistance is to be measured, apparatus for use in making such a measurement comprising:
   first and second electrical terminals, each disposed against a surface of said body of material, said second terminal extending in a closed path on said body surface, and said first terminal lying within said path so that said first terminal is surrounded by said second terminal;
   a layer of insulative material lying on the surface of said body, said insulative layer having a plurality of narrow grooves therein, and wherein each of said electrical terminals includes a wide layer lying on said insulative layer, with the wide layer on said second terminal being largely ring shaped, and a narrower portion lying in one of said grooves and contacting said body surface.

2. A method for measuring the resistance of a body of material having a surface, comprising:

establishing a layer of insulative material on the surface of the body, which has narrow grooves therein;

establishing a plurality of terminals on said surface, wherein a first terminal extends in a closed path about a second termainal, including establishing wide terminal portions on said insulative layer and narrower terminal portions that extend through said grooves and contact said body surface; and connecting a resistance measuring means between said first and second terminals and measuring the resistance between them.

* * * * *